United States Patent
Hong et al.

(10) Patent No.: US 10,255,131 B2
(45) Date of Patent: Apr. 9, 2019

(54) STORAGE DEVICE INCLUDING NONVOLATILE MEMORY DEVICE

(71) Applicant: SAMSUNG ELECTRONICS CO., LTD., Suwon-si (KR)

(72) Inventors: SeongCheol Hong, Hwaseong-si (KR); SongHo Yoon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 15/097,408

(22) Filed: Apr. 13, 2016

(65) Prior Publication Data

US 2017/0010838 A1 Jan. 12, 2017

(30) Foreign Application Priority Data

Jul. 6, 2015 (KR) .................. 10-2015-0095750

(51) Int. Cl.
| | |
|---|---|
| *G06F 12/00* | (2006.01) |
| *G06F 11/10* | (2006.01) |
| *G06F 12/02* | (2006.01) |
| *G11C 29/02* | (2006.01) |
| *G11C 29/04* | (2006.01) |

(52) U.S. Cl.
CPC ...... *G06F 11/1048* (2013.01); *G06F 12/0246* (2013.01); *G06F 2212/1032* (2013.01); *G06F 2212/7208* (2013.01); *G06F 2212/7209* (2013.01); *G11C 29/028* (2013.01); *G11C 2029/0411* (2013.01)

(58) Field of Classification Search
CPC ............. G06F 11/1048; G06F 12/0246; G06F 2212/1032

USPC ......................................................... 711/103
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2003/0191916 A1* | 10/2003 | McBrearty | G06F 11/1464 711/162 |
| 2007/0011415 A1* | 1/2007 | Kaakani | G06F 12/0269 711/159 |

(Continued)

FOREIGN PATENT DOCUMENTS

| | | |
|---|---|---|
| KR | 1020140037768 A | 3/2014 |
| KR | 1020140044640 A | 4/2014 |

(Continued)

*Primary Examiner* — Jae U Yu
(74) *Attorney, Agent, or Firm* — Sughrue Mion, PLLC

(57) ABSTRACT

A storage device is provided. The storage device includes a nonvolatile memory device including memory blocks, and a controller configured to perform write, read and erase operations with respect to a selected memory block from among the memory blocks. If the number of error bits is greater than a critical value in a read operation with respect to the selected memory block, the controller is configured to perform a read reclaim of migrating valid data stored in the selected memory block to another memory block through at least two migration operations. In the read reclaim, the controller is configured to adjust an amount of data migrated in one migration operation.

20 Claims, 14 Drawing Sheets

(56) References Cited

U.S. PATENT DOCUMENTS

| | | | |
|---|---|---|---|
| 2008/0082736 A1* | 4/2008 | Chow | G06F 12/0246 |
| | | | 711/103 |
| 2011/0233648 A1 | 9/2011 | Seol et al. | |
| 2014/0082459 A1 | 3/2014 | Li et al. | |
| 2014/0101372 A1 | 4/2014 | Jung et al. | |
| 2014/0215133 A1 | 7/2014 | Seo et al. | |
| 2014/0281281 A1 | 9/2014 | Zhang et al. | |
| 2014/0301140 A1 | 10/2014 | Camp et al. | |
| 2014/0307508 A1* | 10/2014 | Rhie | G11C 16/0483 |
| | | | 365/185.17 |

FOREIGN PATENT DOCUMENTS

| | | |
|---|---|---|
| KR | 1020140075396 A | 6/2014 |
| KR | 1020140118555 A | 10/2014 |

* cited by examiner

STORAGE DEVICE INCLUDING NONVOLATILE MEMORY DEVICE

CROSS-REFERENCE TO RELATED APPLICATIONS

This U.S. non-provisional patent application claims priority under 35 U.S.C. § 119 from Korean Patent Application No. 10-2015-0095750, filed on Jul. 6, 2015, the entire contents of which are hereby incorporated herein by reference.

BACKGROUND

1. Field

Apparatuses and methods consistent with exemplary embodiments relate to semiconductor devices, and more particularly, to a storage device including a nonvolatile memory device.

2. Related Art

Storage devices store data under the control of a host device such as a computer, a smart phone, a smart pad, etc. Storage devices include a device storing data in a magnetic disk like a HDD (hard disk drive) and a device storing data in a semiconductor memory, in particular, a nonvolatile memory like a SSD (solid state drive), a memory card, etc.

Examples of a nonvolatile memory include a ROM (read only memory), a PROM (programmable ROM), an EPROM (electrically programmable ROM), an EEPROM (electrically erasable and programmable ROM), a flash memory, a PRAM (phase-change RAM), a MRAM (magnetic RAM), a RRAM (resistive RAM), a FRAM (ferroelectric RAM), etc.

As a semiconductor manufacturing technology develops, an operation speed of a host device, such as a computer, a smart phone, a smart pad, etc. that communicates with a storage device is being improved. A capacity of contents being used in a storage device and a host device of the storage device is being increased. Accordingly, there is a demand for a storage device having even more improved operation speed.

SUMMARY

According to an aspect of an exemplary embodiment, a storage device is provided. The storage device includes a nonvolatile memory device including memory blocks, and a controller configured to perform write, read and erase operations with respect to a selected memory block from among the memory blocks. If a number of error bits is greater than a critical value in a read operation with respect to the selected memory block, the controller is configured to perform a read reclaim of migrating valid data stored in the selected memory block to another memory block through at least two migration operations. In the read reclaim, the controller is configured to adjust an amount of data migrated in one migration operation.

According to an aspect of an exemplary embodiment, a storage device is provided. The storage device includes a random access memory, a nonvolatile memory device including memory blocks, and a controller configured to perform write, read and erase operations with respect to a selected memory block from among the memory blocks. If a number of error bits is greater than a critical value in a read operation with respect to the selected memory block, the controller is configured to perform a read reclaim through at least two migration operations each including reading valid data stored in the selected memory block, storing the read data in the random access memory and writing the data stored in the random access memory in another memory block of the nonvolatile memory device. In the read reclaim, the controller is configured to adjust an amount of data to be migrated from the selected memory block to the other memory block in one migration operation.

According to an aspect of an exemplary embodiment, a storage device is provided. The storage device includes: a nonvolatile memory device including memory blocks; and a controller configured to, if a number of error bits is greater than a critical value in a read operation with respect to a selected memory block from among the memory blocks, perform a read reclaim of migrating valid data stored in the selected memory block to another memory block through at least two migration operations, wherein the controller is configured to adjust an amount of data migrated in one migration operation being performed in the read reclaim.

The controller may be configured to increase the amount of data to be migrated if a read reclaim is already being performed when the read reclaim with respect to the selected memory block begins.

The controller may be configured to reduce the amount of data to be migrated in response to the read reclaim that is being performed being completed.

The controller may be configured to reduce the amount of data to be migrated as reliability of the selected memory block increases.

The controller may be configured to increase the amount of data to be migrated as reliability of the selected memory block decreases.

BRIEF DESCRIPTION OF THE FIGURES

Exemplary embodiments of the inventive concept will be described below in more detail with reference to the accompanying drawings. The exemplary embodiments of the inventive concept may, however, be embodied in different forms and should not be constructed as limited to the exemplary embodiments set forth herein. Rather, these exemplary embodiments are provided so that this disclosure will be thorough and complete, and will fully convey the scope of the inventive concept to those skilled in the art. Like numbers refer to like elements throughout.

DETAILED DESCRIPTION

Figure 1:
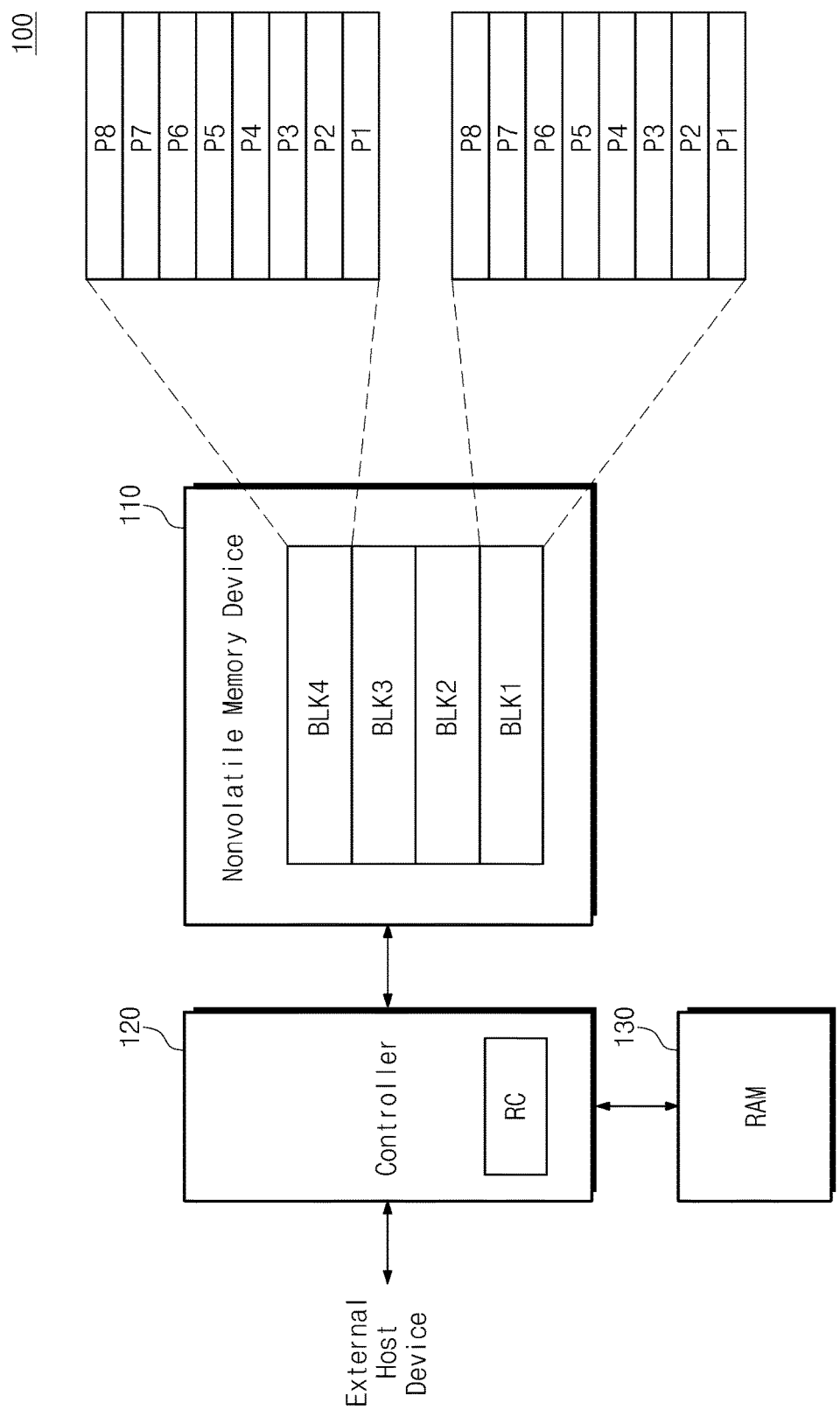
FIG. 1 is a block diagram illustrating a storage device according to an exemplary embodiment.

Exemplary embodiments will be described more fully hereinafter with reference to the accompanying drawings, in which the exemplary embodiments are shown. The exemplary embodiments may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating a storage device 100 according to an exemplary embodiment. Referring to FIG. 1, the storage device 100 includes a nonvolatile memory device 110, a controller 120 and a RAM 130.

The nonvolatile memory device 110 includes a plurality of memory blocks BLK1~BLK4. Each of the memory blocks BLK1~BLK4 may be an erase operation unit. For example, data written in one memory block may be erased at the same time. The memory blocks BLK1~BLK4 may be physical storage spaces distinguished by a block address. The nonvolatile memory device 110 is illustrated that includes 4 memory blocks BLK1~BLK4. However, the number of memory blocks of the nonvolatile memory device 110 is not limited to 4.

Each of the memory blocks BLK1~BLK4 includes pages P1~P8. For example, the pages P1~P8 may be logical pages or physical pages. Each physical page may correspond to a physical storage space distinguished by a block address and a row address. One physical page may include two or more logical pages. Each logical page may include a logical storage space distinguished by an additional address (or offset) distinguishing logical pages together with an address of the physical page. The page may indicate a logical page or a physical page, and is not limited to any one of the logical page and the physical page. In FIG. 1, each page memory block is illustrated that includes 8 pages (P1~P8). However, the number of pages being provided to each memory block is not limited to 8.

The controller 120 is configured to control the nonvolatile memory device 110. The controller 120 can communicate with an external host device. The controller 120 is configured to control a write, a read and an erase with respect to the nonvolatile memory device 110 according to a request of an external host device or an internal schedule. The controller 120 can further control a read reclaim with respect to the nonvolatile memory device 110. The read reclaim operation changes the access relationship between a logical address and multiple physical addresses. By changing the physical location of data accessed by a particular logical address (i.e., a LBA), wear may be spread across a range of blocks or memory cells within a block.

For example, the read reclaim, if reliability of data written in a specific memory block, for example, the first memory block BLK1 is lowered, may be an operation of migrating valid data written in the first memory block BLK1 to another memory block, for example, the second memory block BLK2. For example, the migration may include operations of reading source data written in the first memory block BLK1 to store it in the RAM 130, writing the data stored in the RAM 130 in the second memory block BLK2 and invalidating the source data of the first memory block BLK1. For example, the second memory block BLK2 may be a memory block of an erase state in which data is not written.

While migrating valid data written in the first memory block BLK1 to the second memory block BLK2, the memory blocks BLK1 and BLK2 in which a read reclaim is performed enter into a busy state. That is, if a read reclaim is performed, the latency of the memory blocks BLK1 and BLK2 in which a read reclaim is performed increases.

To reduce latency that occurs by a read reclaim, the controller 120 can divide the read reclaim to perform it through at least two migration operations. For example, in a read reclaim operation, the controller 120 can migrate first valid data of the first memory block BLK1 to the second memory block BLK2 through a first migration operation. After that, the controller 120 can migrate second valid data of the first memory block BLK1 to the second memory block BLK2 through a second migration operation. The first and second memory blocks BKL1 and BLK2 are accessible between the first and second migration operations. For example, each migration operation may include operations of reading source data from the first memory block BLK1 to store it in the RAM 130, writing the data stored in the RAM 130 in the second memory block BLK2 and invalidating the source data of the first memory block BLK1.

The controller 120 includes a reclaim calculator RC. The controller 120 is configured to calculate an amount (hereinafter it is referred to as copy data amount) of data to be migrated in one migration operation using the reclaim calculator RC. For example, the controller 120 can calculate an amount of copy data according to reliability and an amount of valid data written in a source memory block of a read reclaim, for example, the first memory block BLK1.

Figure 2:
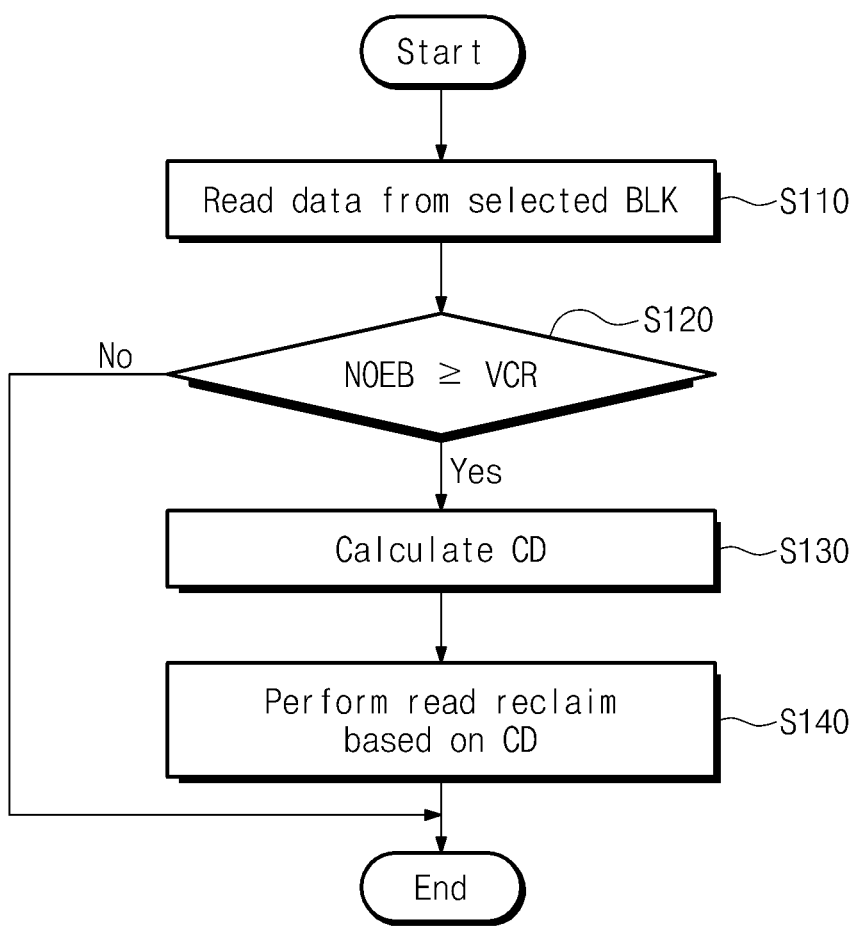
FIG. 2 is a flowchart illustrating an operation method of a storage device according to an exemplary embodiment.

FIG. 2 is a flowchart illustrating an operation method of a storage device 100 in accordance with an exemplary embodiment. Referring to FIGS. 1 and 2, in operation S110, the controller 120 reads data from a selected memory block BLK. For example, the controller 120 can read data from a selected memory block according to a request of an external host device or an internal schedule.

In operation S120, the controller 120 judges whether the number of error bits (NOEB) of data read from the selected memory block is greater than or equal to a critical value VCR. For example, the number of error bits may be judged based on an error correction code (ECC). If the number of error bits is greater than or equal to the critical value VCR, the controller 120 can begin (or trigger) a read reclaim with respect to the selected memory block.

In operation S130, the controller 120 can calculate an amount of copy data (CD) to be migrated through one migration operation in a read reclaim. For example, the controller 120 can calculate an amount of CD according to reliability and an amount of valid data of the selected memory block using the reclaim calculator RC. For example, the controller 120 can calculate an amount of CD corresponding to target memory blocks of the read reclaim including the selected memory block.

In operation S140, the controller 120 can perform a read reclaim based on the amount of CD. For example, the controller 120 can migrate valid data corresponding to the amount of CD in one migration operation with respect to target memory blocks of the read reclaim.

Figure 3:
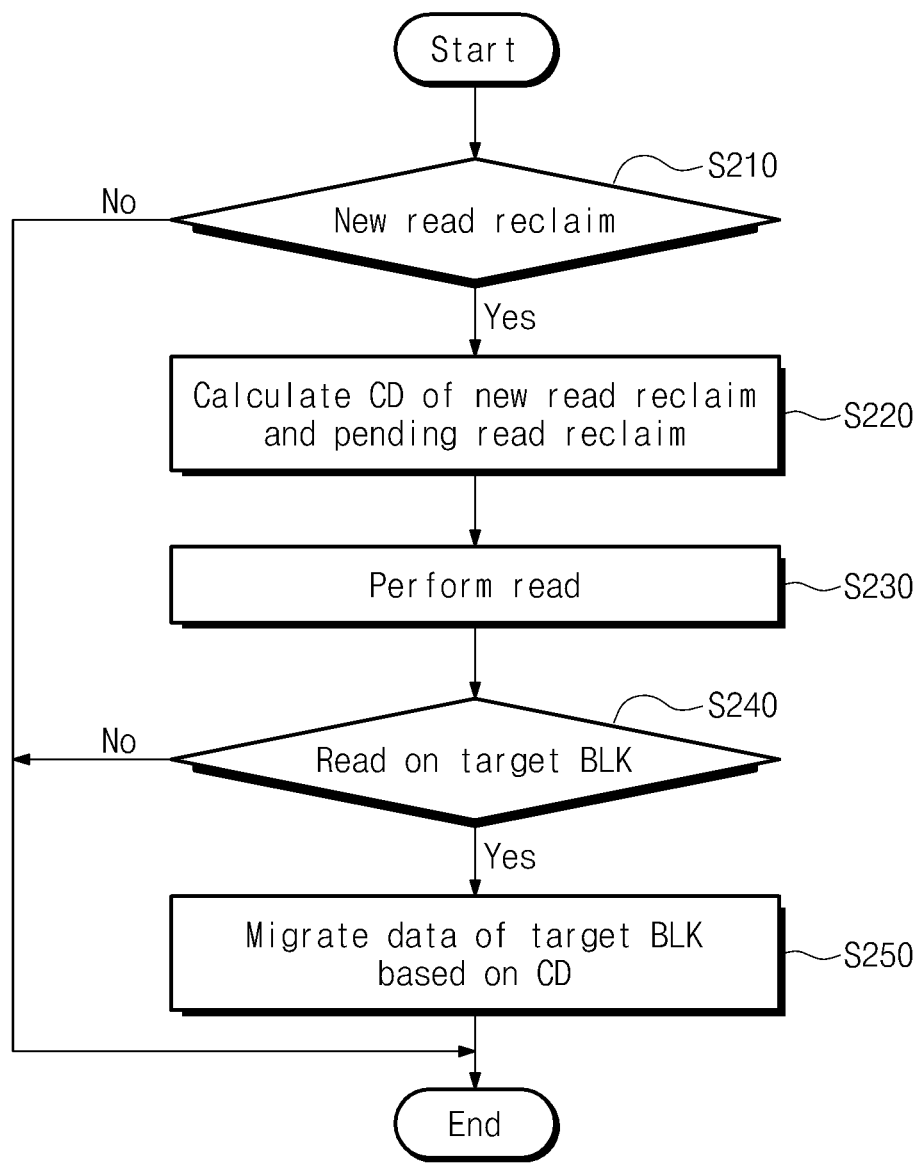
FIG. 3 is a flowchart illustrating a first example of calculating an amount of copy data to perform a read reclaim based on the amount of copy data.

FIG. 3 is a flowchart illustrating a first example of calculating (operation S130) an amount of copy data and performing (operation S140) a read reclaim based on the amount of copy data. Referring to FIGS. 1 and 3, in operation S210, the controller 120 judges whether a triggered read reclaim is a new read reclaim.

A read reclaim in accordance with exemplary embodiments of the inventive concept may be divided into two or more migration operations to be performed. Target memory blocks of the read reclaim and other memory blocks are accessible between a first migration operation and a second migration operation. If a read operation with respect to the target memory blocks of the read reclaim is performed between the first migration operation and the second migration operation, the read reclaim may be again triggered. A memory block in which a read reclaim is again triggered is already registered as a target memory block of the read reclaim. Thus, a trigger of the replicative read reclaim may be ignored and a calculation for an amount of CD may be omitted.

In an exemplary embodiment, the operation S210 may be omitted. That is, even though the replicative read reclaim occurs, a calculation for the amount of CD may be performed. Thus, a frequency of performance of a calculation for the amount of CD increases and latency that occurs by the read reclaim may be further reduced.

In operation S220, the controller 120 calculates an amount of CD of a pending read reclaim and a new read reclaim. For example, the controller 120 can calculate an amount of CD based on a mathematical formula 1.

$$CD = \sum_{i=1}^{BC} \frac{VCDi}{RMi} \quad \text{[mathematical formula 1]}$$

In the mathematical formula 1, a block count BC indicates the number of target memory blocks of the pending read reclaim. A valid count VCDi indicates an amount of valid data of an ith target memory block, for example, the number of valid pages. A reliability margin RMi indicates the number of times of read operations that can be performed in the ith target memory block while data of the ith target memory block is not lost.

The reliability margin RMi may be a fixed value or a value being calculated according to an algorithm. For example, the reliability margin RMi may be changed depending on the number of times of erase operations of the ith target memory block, elapsed time from when valid data is written in the ith target memory block, and a temperature when valid data is written in the ith target memory block or a current temperature. As the number of times of erase operations of the ith target memory block increases, the reliability margin RMi may decrease. As elapsed time from when valid data is written in the ith target memory block increase, the reliability margin RMi may decrease. As a difference between a first temperature when valid data is written in the ith target memory block and a second temperature when an amount of CD is calculated increases, the reliability margin RMi may decrease.

As the reliability margin RMi decreases, that is as reliability of the ith target memory block degrades, the amount of CD may increase. As the reliability margin RMi increases, that is as reliability of the ith target memory block is improved, the amount of CD may be reduced.

After the amount of CD is calculated, a read request may occur according to an external host or an internal schedule of the controller 120. In operation S230, the controller 120 can perform a read operation with respect to the nonvolatile memory device 110 according to a read request.

In operation S240, the controller 120 determines whether a read operation is performed in the target memory block of the read reclaim. If a read operation is performed in the target memory block of the read reclaim, in operation S250, valid data of the target memory block of the read reclaim is migrated by a migration operation based on the amount of CD.

That is, the controller 120 is configured to dynamically calculate the amount of CD based on valid counts VCDi and the reliability margins RMi of the target memory block of the read reclaim. If a read operation is performed in one of the target memory block of the read reclaim, the controller 120 may perform one migration operation in the target memory block of the read reclaim.

The target memory block of the read reclaim may be migrated based on first-in, first-out (FIFO). For example, the first and second memory blocks BLK1 and BLK2 may be sequentially registered as target memory blocks of read reclaim. After migration of valid data of the first memory block BLK1 is completed, that is after a read reclaim of the first memory block BLK1 is completed, migration of the second memory block BLK2 may begin.

Figure 4:
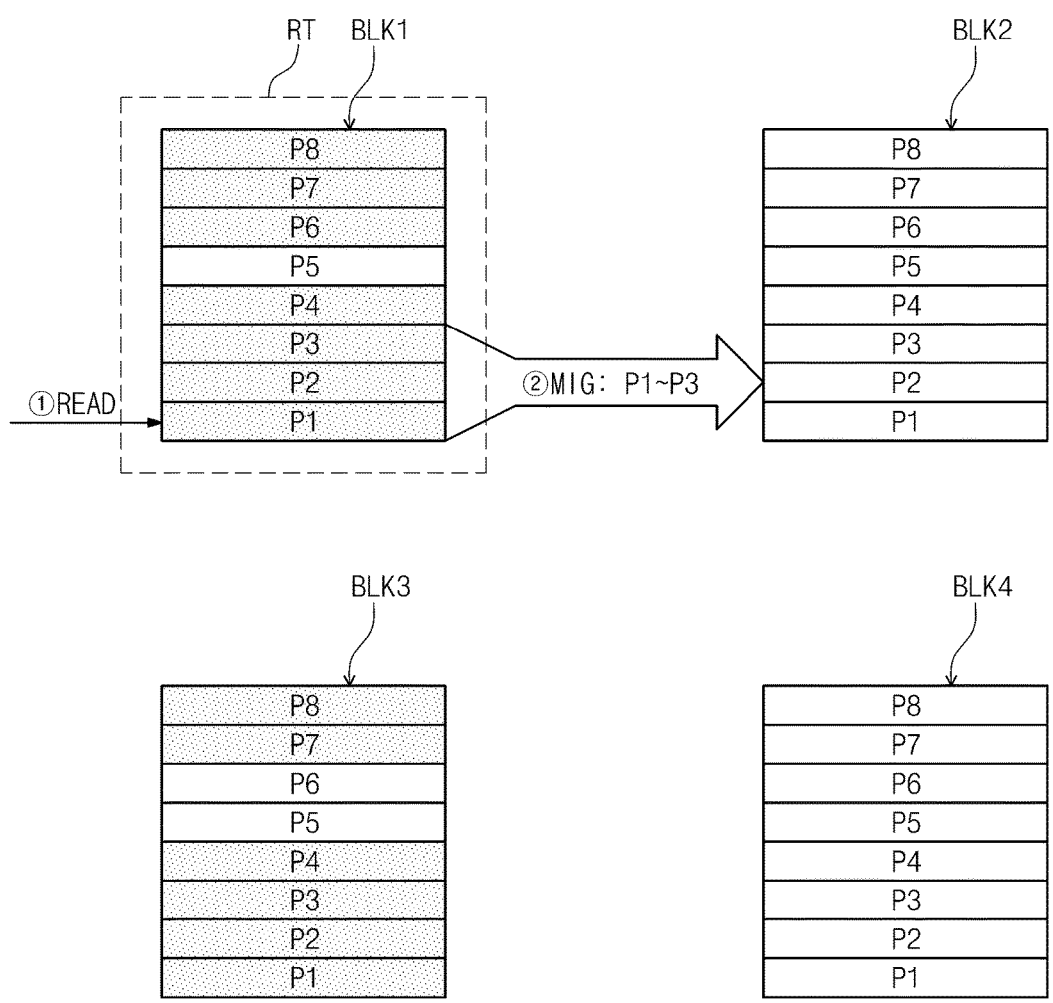
FIGS. 4 through 7 are drawings illustrating a process in which a read reclaim is performed according to a method illustrated in FIG. 3.

FIGS. 4 through 7 are drawings illustrating a process in which a read reclaim is performed according to a method illustrated in FIG. 3. Referring to FIGS. 1 and 4, first through fourth blocks BLK1~BLK4 are illustrated. First through fourth pages P1~P4 and sixth through eighth pages P6~P8 of the first memory block BLK1 may store valid data. First through fourth pages P1~P4 and seventh and eighth pages P7 and P8 of the third memory block BLK3 may store valid data.

It is assumed that the first memory block BLK1 is registered as target memory blocks RT of a read reclaim before. It is also assumed that an amount of CD associated with the target memory blocks RT is 3 pages.

In a first step ①, a read operation with respect to the first page P1 of the first memory block BLK1 may be requested according to an external host device or an internal schedule of the controller 120. The controller 120 can read data to be written in the first page P1 of the first memory block BLK1, output the data to the outside or use the data according to an internal schedule.

Since a read operation with respect to the target memory blocks RT of the read reclaim is performed, in a second step ②, a one migration operation MIG is performed on the target memory blocks RT of the read reclaim. Valid data stored in the first through third pages P1~P3 corresponding to the amount of CD is migrated to the second memory block BLK2.

Figure 5:
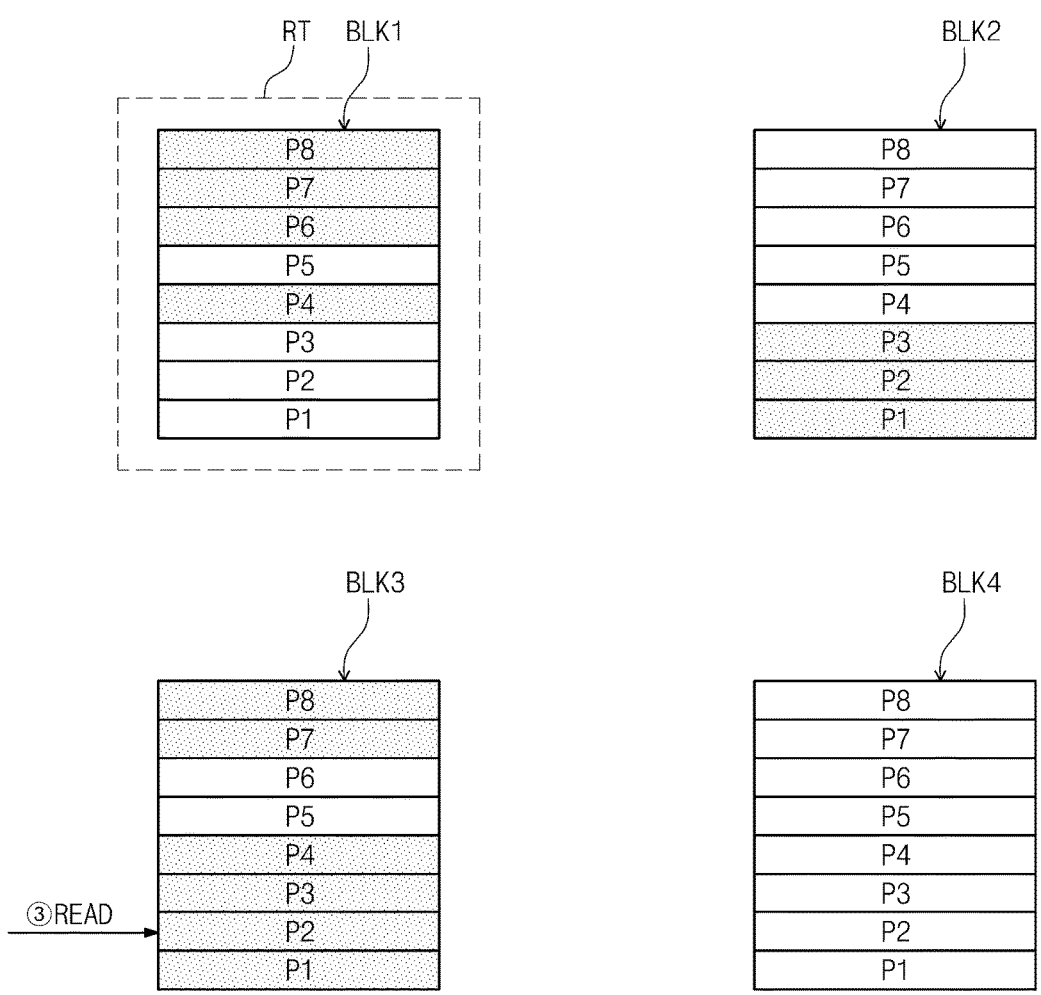

Referring to FIGS. 1 and 5, valid data stored in the first through third pages P1~P3 of the first memory block BLK1 have been migrated to first through third pages P1~P3 of the second memory block BLK2.

In a step ③, a read operation with respect to the second page P2 of the third memory block BLK3 may be performed. Since the third memory block BLK3 does not belong to the target memory blocks RT of the read reclaim, even if the read operation of the third step ③ is performed, a migration operation is not performed.

Figure 6:
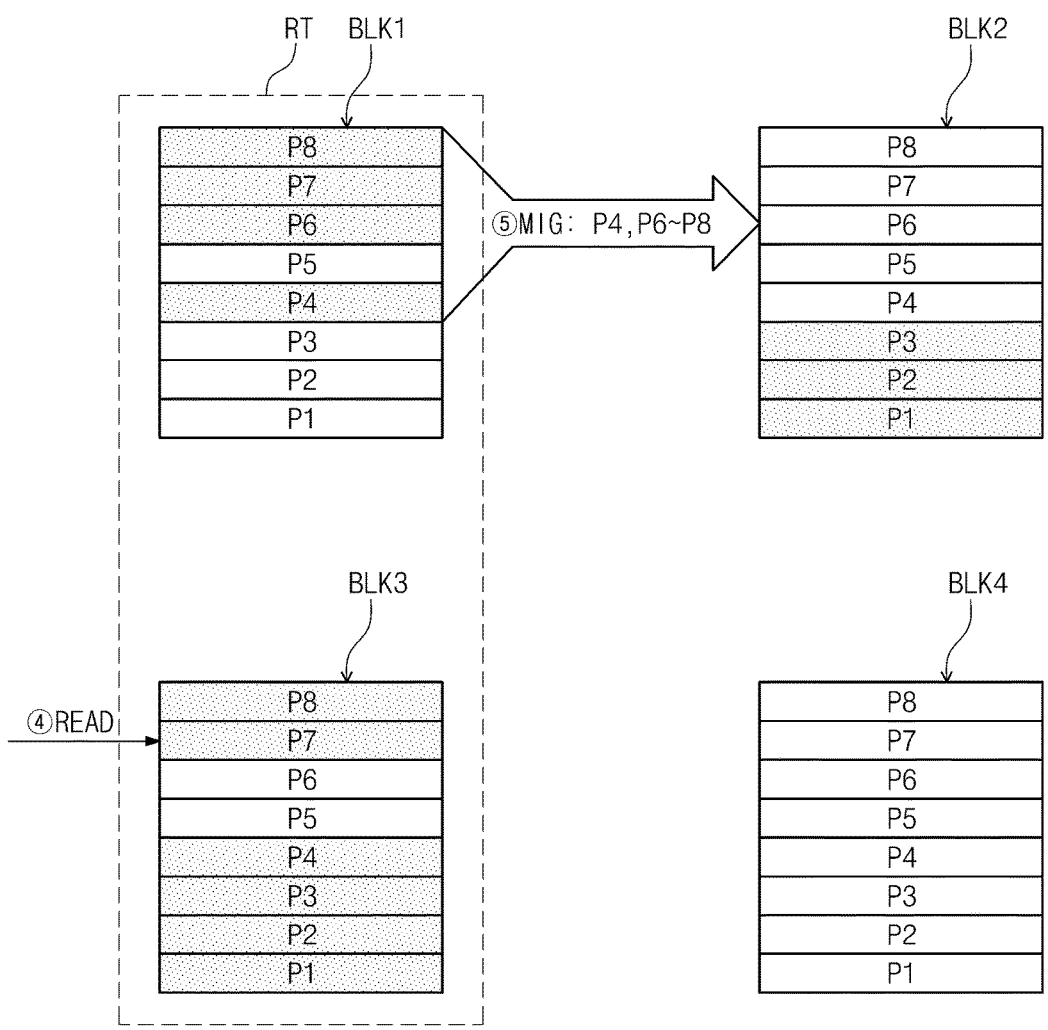

If the read operation of the third step ③ is performed, as illustrated in FIGS. 1 and 6, the third memory block BLK3 may be registered as the target memory blocks RT of the read reclaim. For example, as illustrated in FIG. 2, in the read operation of the third step ③, the number of error bits (NOEB) may be greater than a critical value VCR. As the third memory block BLK3 is added to the target memory blocks RT of the read reclaim, the amount of CD may be calculated again. The amount of CD may be calculated as 4 pages.

In a fourth step ④, a read operation with respect to the seventh page P7 of the third memory block BLK3 may be performed. Since the third memory block BLK3 belongs to the target memory blocks RT of the read reclaim, one migration operation is performed on the target memory blocks RT of the read reclaim. Since the first memory block BLK1 is registered as the target memory blocks RT of the read reclaim before the third memory block BLK3, in a fifth step ⑤, one migration operation is performed on the first memory block BLK1. For example, valid data stored in the fourth and sixth through eighth pages P4 and P6~P8 corresponding to the amount of CD may be migrated to the second memory block BLK2.

Figure 7:
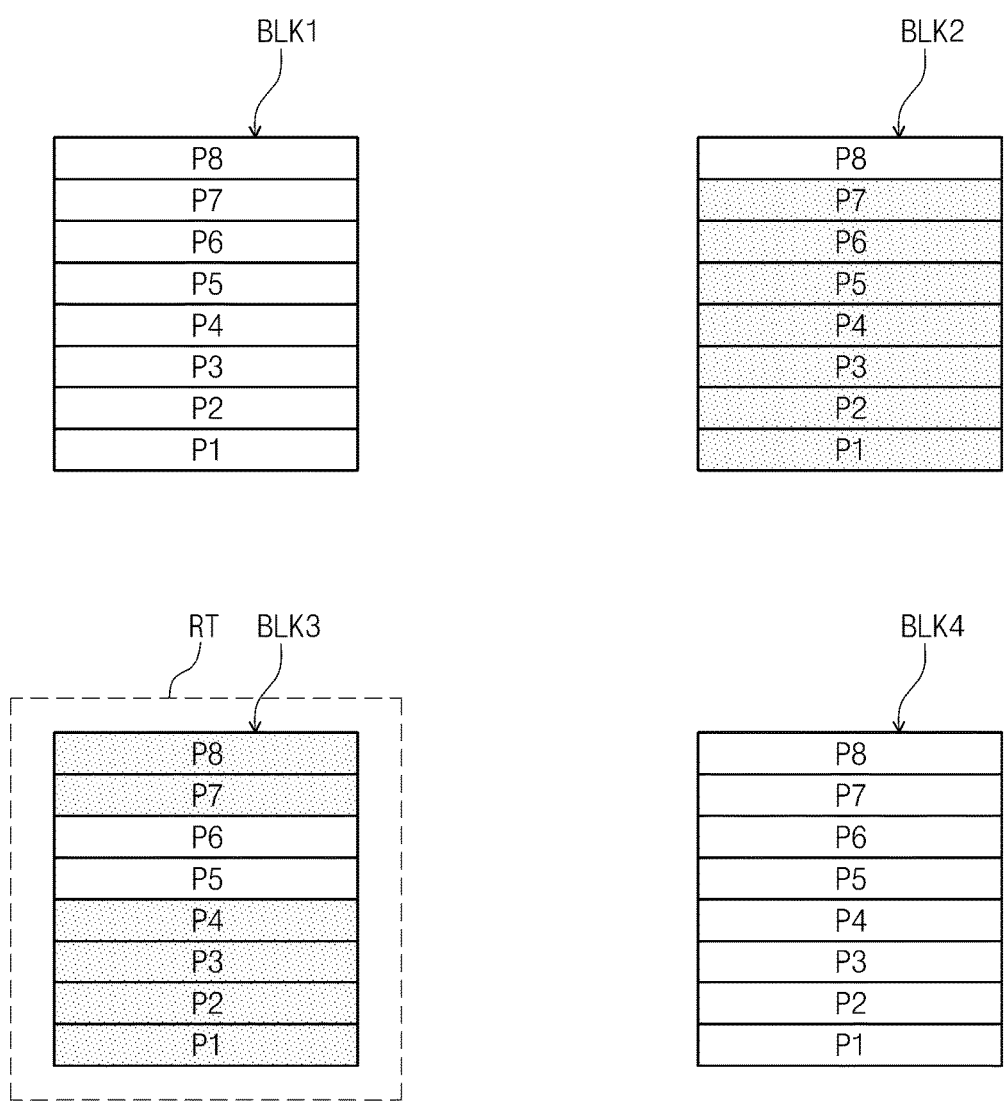

Referring to FIGS. 1 and 7, the fourth and sixth through eighth pages P4 and P6~P8 of the first memory block BLK1 have been migrated to fourth through seventh pages P4~P7 of the second memory block BLK2.

If a migration operation MIG of the fifth step ⑤ is performed, valid data does not exist in the first memory block BLK1. That is, migration of valid data of the first memory block BLK1 is completed and a read reclaim of the first memory block BLK1 is completed. Thus, the controller 120 can release the first memory block BLK1 from the target memory blocks RT of the read reclaim.

As the first memory block BLK1 is released from the target memory blocks RT of the read reclaim, the controller 120 can calculate the amount of CD again.

Figure 8:
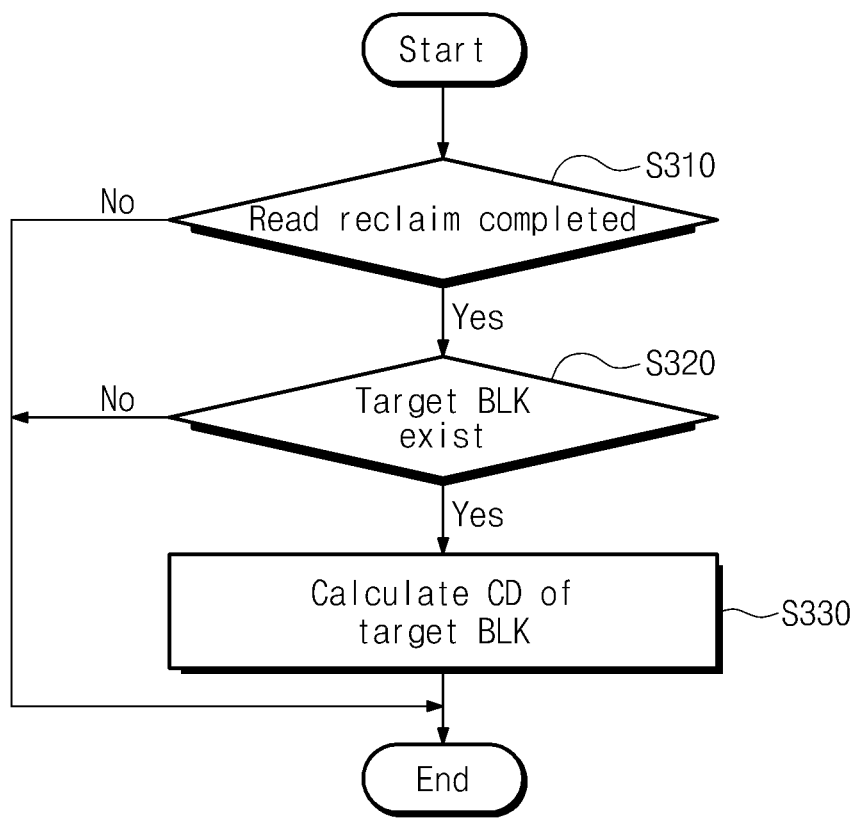
FIG. 8 is a flowchart illustrating a first example in which a controller calculates an amount of copy data again.

FIG. 8 is a flowchart illustrating a first example that a controller calculates an amount of copy data again. Referring to FIGS. 1 and 8, in operation S310, the controller 120 determines whether a read reclaim of one memory block among target memory blocks RT of a read reclaim is completed. If the read reclaim is completed, in operation S320, the controller 120 determines whether the target memory blocks RT of the read reclaim exist. If the target memory blocks RT of the read reclaim exist, in operation S330, the controller 120 can calculate an amount of CD of the target memory blocks RT of the read reclaim according to the mathematical formula 1.

Figure 9:
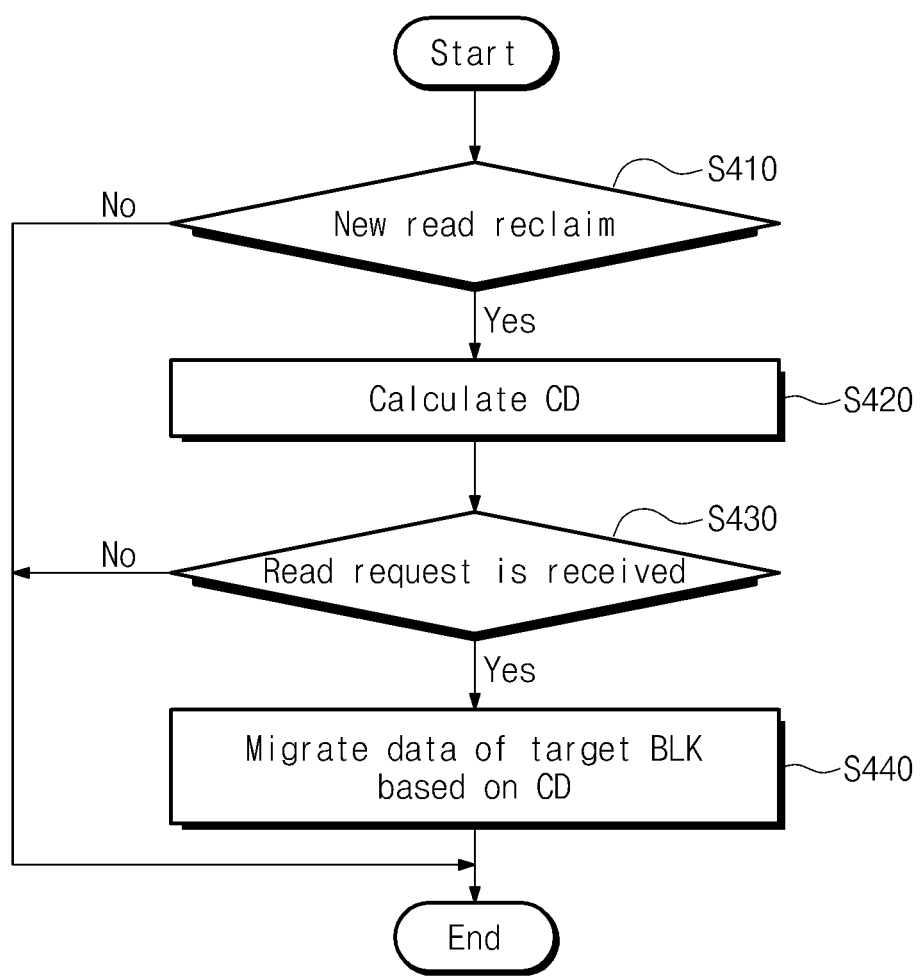
FIG. 9 is a flowchart illustrating a second example of calculating an amount of copy data to perform a read reclaim based on the amount of copy data.

FIG. 9 is a flowchart illustrating a second example of calculating an amount of copy data CD to perform a read reclaim based on the amount of copy data CD. Referring to FIGS. 1 and 9, in operation S410, the controller 120 determines whether a triggered read reclaim is a new read reclaim. In operation S420, the controller 120 calculates an amount of CD of target memory blocks RT of a read reclaim. The controller 120 can calculate the amount of CD according to a mathematical formula 2.

$$CD = \sum_{i=1}^{BC} \frac{VCDi}{\left(\frac{RMi}{RD}\right)}$$ [mathematical formula 2]

In the mathematical formula 2, a block count BC indicates the number of target memory blocks of the read reclaim. A valid count VCDi indicates an amount of valid data of an ith target memory block, for example, the number of valid pages. A reliability margin RMi indicates the number of times of read operations that can be performed in the ith target memory block while data of the ith target memory block is not lost. A read disturbance RD may be a value obtained by digitizing read disturbance that occurs at a memory block of the nonvolatile memory device 110 according to a read request being received from an external host. When reading data from the nonvolatile memory device 110, the controller 120 can read the data by a page unit. An external host device can transmit a read request to the controller 120 on the basis of a host access unit. For example, the external host device can ask the controller 120 to read data of a host access unit through a read request. A size of the host access unit may correspond to a size of two or more pages. That is, if the external host device transmits a read request to the controller 120, the controller 120 can perform two or more read operations on the nonvolatile memory device 110.

The read disturbance RD may indicate read disturbance that occurs when two or more read operations with respect to the nonvolatile memory device 110 that occurs according to a read request are concentrated on a memory block that belongs to target memory blocks RT of a read reclaim.

In operation S430, the controller 120 determines whether a read request is received from the external host device. If the read request is received from the external host device, in operation S440, the controller 120 migrates valid data of the target memory blocks of the read reclaim by a migration operation based on an amount of CD.

According to the method described with reference to FIG. 9, the controller 120 does not refer to whether a read request being received from the external host device causes a read with reference to the target memory blocks RT of a read reclaim. The controller 120 can determine the amount of CD based on a worst case in which reads requested by the external host device are concentrated on a memory block that belongs to the target memory blocks RT of a read reclaim.

As described with reference to FIG. 8, when a read reclaim of a memory block that belongs the target memory blocks RT of the read reclaim is completed, the amount of CD may be calculated again according to the mathematical formula 2.

Figure 10:
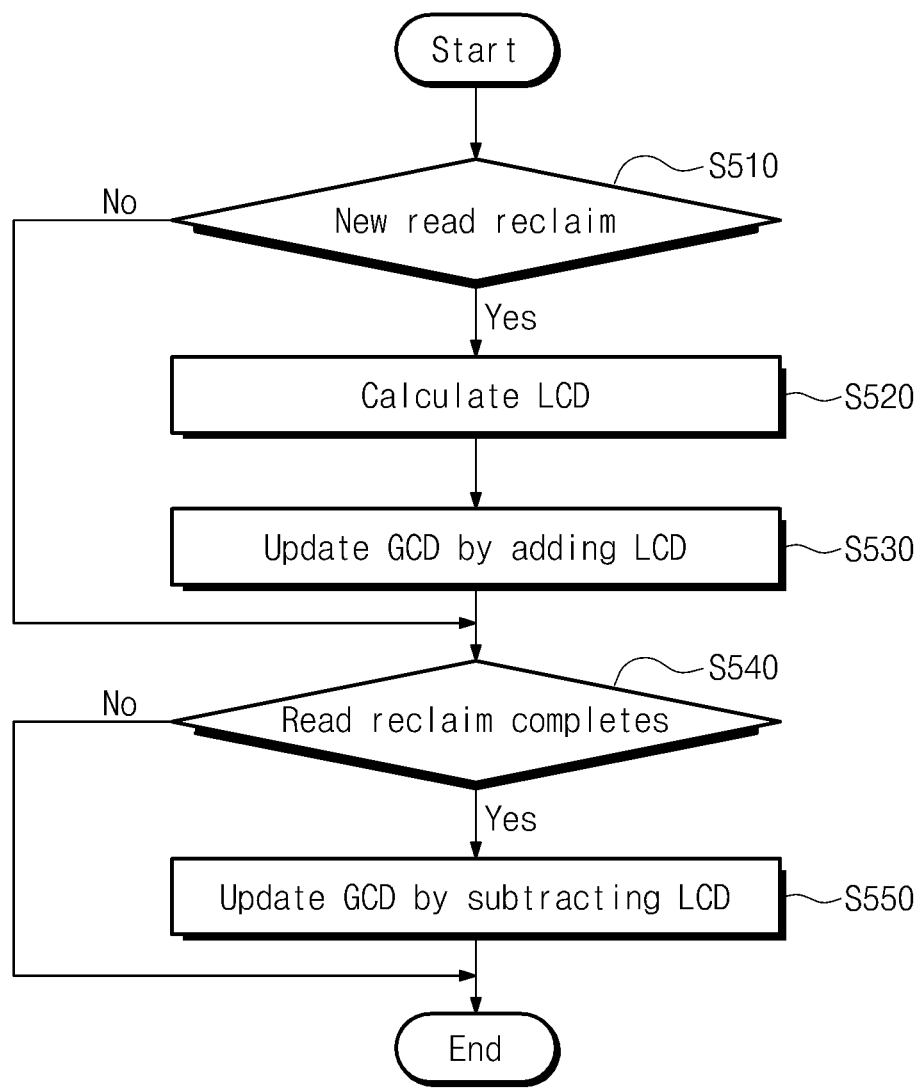
FIG. 10 is a flowchart illustrating another example that a controller calculates an amount of copy data.

FIG. 10 is a flowchart illustrating another example in which a controller calculates an amount of copy data. Referring to FIGS. 1 and 10, in operation S510, the controller 120 determines whether a triggered read reclaim is a new read reclaim.

If the triggered read reclaim is a new read reclaim, in operation S520, the controller 120 calculates an amount of local copy data (LCD) of a memory block corresponding to the new read reclaim. The amount of the LCD may be a value calculated with respect to not the whole target memory block RT of the read reclaim but a memory block in which a read reclaim is newly triggered. For example, the amount of the LCD may be calculated by setting the block count BC as '1' in the mathematical formulas 1 and 2.

In operation S530, the controller 120 can update an amount of global copy data (GCD). For example, the amount of the GCD may be a value calculated with respect to the whole target memory block RT of the read reclaim. For example, the controller 120 can update the amount of the GCD by adding the amount of the LCD newly calculated to the amount of the GCD.

In operation S540, the controller 120 determines whether a read reclaim of one memory block among the target memory blocks RT of the read reclaim is completed. If the read reclaim of one memory block is completed, in operation S550, the controller 120 updates the amount of the GCD. For example, the controller 120 can update the amount of the GCD by subtracting the amount of the LCD of a memory block in which the read reclaim is completed from the amount of the GCD.

The controller 120 can perform a read reclaim while managing the amount of the GCD according to the method illustrated in FIG. 10. For example, the amount of the LCD can be calculated according to the mathematical formula 1. When a read operation is performed on the target memory blocks RT of the read reclaim, the controller 120 can perform one migration operation based on the amount of the GCD. As another example, the amount of the LCD can be calculated according to the mathematical formula 2. When a read request is received from an external host device, the controller 120 can perform one migration operation based on the amount of the GCD.

Referring to FIG. 1 again, the nonvolatile memory device 110 can perform read and erase operations under the control of the controller 120. The nonvolatile memory device 110 can receive a command and an address from the controller 120 through an input/output channel. The nonvolatile memory device 110 can exchange data with the controller 120 through an input/output channel.

The nonvolatile memory device 110 can change a control signal with the controller 120 through a control channel. For example, the nonvolatile memory device 110 can receive a chip enable signal /CE selecting at least one nonvolatile memory chip among the nonvolatile memory chips of the nonvolatile memory device 110, a command latch enable signal CLE indicating that a signal being received from the controller 120 through an input/output channel is a command, an address latch enable signal ALE indicating that a signal being received from the controller 120 through an input/output channel is an address, a read enable signal /RE that is generated by the controller 120 in a read operation and periodically toggled to be used to adjust timing, a write enable signal /WE being activated by the controller 120 when a command or an address is transmitted, a write protection signal /WP being activated by the controller 120 to prevent an unwanted write or erase when a power supply is changed, and a data strobe signal DQS that is generated by the controller 120 in a write operation and periodically toggled to be used to adjust a sync of data being transmitted through an input/output channel from the controller 120. The nonvolatile memory device 110 can also output a ready & busy signal R/nB indicating that the nonvolatile memory device 110 is performing a program, erase or read operation and a data strobe signal DQS that is generated from the read enable signal /RE by the nonvolatile memory device 110 and periodically toggled to be used to adjust an output sync of data to the controller 120.

The nonvolatile memory device 110 may include a flash memory. However, the nonvolatile memory device 110 is not limited to include a flash memory. The nonvolatile memory device 110 may include at least one of various nonvolatile memory devices such as a PRAM (phase change RAM), a MRAM (magnetic RAM), a RRAM (resistive RAM), a FeRAM (ferroelectric RAM), etc.

The controller 120 is configured to control the nonvolatile memory device 110. For example, the controller 120 can control the nonvolatile memory device 110 to perform a write, read or erase operation through an input/output channel or a control channel.

The controller 120 can control the nonvolatile memory device 110 under the control of an external host device (not shown). For example, the controller 120 can communicate with the external host device according to a format different from a format being used when communicating with the nonvolatile memory device 110. A unit of data by which the controller 120 communicates with the nonvolatile memory device 110 may be different from a unit of data by which the controller 120 communicates with the external host device.

The controller 120 may use the RAM 130 as a buffer memory, a cache memory, or an operation memory. The controller 120 can store data or a code needed to manage the nonvolatile memory device 110 in the RAM 130. For example, the controller 120 can read data or a code needed to manage the nonvolatile memory device 110 from the nonvolatile memory 110 and load the data or the command into the RAM 130 to drive it.

The RAM 130 may include at least one of various random access memories such as a DRAM (dynamic RAM), a SRAM (static RAM), a SDRAM (synchronous DRAM), a PRAM (phase-change RAM), a MRAM (magnetic RAM), a RRAM (resistive RAM), a FeRAM (ferroelectric RAM), etc.

The nonvolatile memory device 110 may include a plurality of nonvolatile memory chips. The controller 120 and the nonvolatile memory chips may be connected to one another based on a channel and a way. One channel may include one data channel and one control channel. One data channel may include 8 data lines. One control channel may include the chip enable signal /CE, the command latch enable signal CLE, the address latch enable signal ALE, the read enable signal /RE, the write enable signal /WE, the write preventing signal /WP and the ready & busy signal R/nB described above.

Nonvolatile memory chips connected to one channel may form a way. If n number of nonvolatile memory chips is connected to one channel, an n-way may be formed. Nonvolatile memory chips that belong one way can share data lines, and control lines transmitting the command latch enable signal CLE, the address latch enable signal ALE, the read enable signal /RE, the write enable signal /WE, and the write protection signal /WP. Each of the nonvolatile memory chips that belong one way can communicate with the controller 120 through exclusive control lines transmitting the chip enable signal /CE and the ready & busy signal R/nB.

The controller 120 can alternately access nonvolatile memory chips of the n-way connected to one channel. The controller 120 can independently access nonvolatile memory chips connected to different channels. The controller 120 can alternately or simultaneously access nonvolatile memory chips connected to different channels.

The nonvolatile memory chips may be connected to the controller 120 in a wide IO form. For example, nonvolatile memory chips connected to different channels can share a control line of one chip enable signal /CE. The nonvolatile memory chips sharing the control line of one chip enable signal /CE may be accessed at the same time. Since data lines of different channels are used at the same time, a wide input/output bandwidth may be accomplished.

The storage device 100 may include a SSD (solid state drive) and a HDD (hard disk drive). The storage device 100 may include memory cards such as a personal computer memory card international association (PCMCIA) card, a compact flash (CF) card, a smart media card (SM, SMC), a memory stick, a multimedia card (MMC, RS-MMC, MMC-micro), a SD card (SD, miniSD, microSD, SDHC), a universal flash memory device (UFS), etc. The storage device 100 may include a mounting type memory such as an eMMC (embedded multimedia card), a UFS, a PPN (perfect page NAND), etc.

In FIG. 1, the storage device 100 is illustrated to include the RAM 130 disposed outside the controller 120. However, the storage device 100 may not include the RAM 130 disposed outside the controller 120. The controller 120 may be configured to use an internal RAM (refer to FIG. 11) as a buffer memory, an operating memory or a cache memory.

Figure 11:
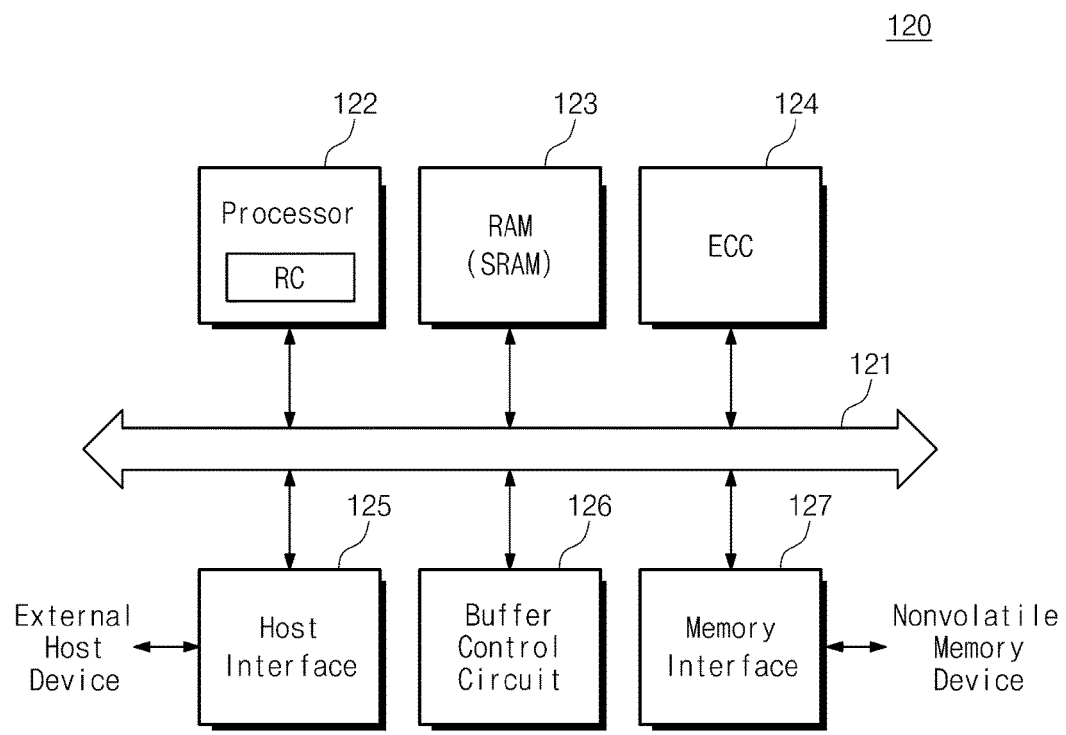
FIG. 11 is a block diagram illustrating a controller according to an exemplary embodiment.

FIG. 11 is a block diagram illustrating a controller in accordance with exemplary embodiments of the inventive concept. Referring to FIGS. 1 and 11, the controller 120 includes a bus 121, a processor 122, a RAM 123, an error correction block 124, a host interface 125, a buffer control circuit 126 and a memory interface 127.

The bus 121 is configured to provide a channel between constituent elements of the controller 120.

The processor 122 can control the overall operation of the controller 120 and perform a logical operation. The processor 122 can communicate with an external host device through the host interface 125, can communicate with the nonvolatile memory device 110 through the memory interface 127, and can communicate with the RAM 130 through the buffer control circuit 126. The processor 122 can control the storage device 100 using the RAM 123 as an operating memory, a cache memory or a buffer memory.

The processor 122 includes a reclaim calculator RC. For example, the reclaim calculator RC may be embodied in hardware to be included in the processor 122. The reclaim calculator RC may be embodied in software to be executed by the processor 122. The reclaim calculator RC may be embodied in combinations of hardware and software.

The RAM 123 may be used as an operating memory, a cache memory or a buffer memory. The RAM 123 can store codes and commands which the processor 122 executes. The RAM 123 can store data being processed by the processor 122. The RAM 123 may include a SRAM (static RAM).

The error correction block 124 can perform an error correction. The error correction block 124 can perform an error correction encoding based on data to be written in the nonvolatile memory device 110 through the memory interface 127. The error correction encoded data may be transmitted to the nonvolatile memory device 110 through the memory interface 127. The error correction block 124 can perform an error correction decoding on data being received from the nonvolatile memory device 110 through the memory interface 127. The error correction block 124 may be included in the memory interface 127 as a constituent element of the memory interface 127.

The host interface 125 is configured to communicate with the external host device under the control of the processor 122. The host interface 125 may be configured to communicate using at least one of various communication methods such as a USB (universal serial bus), a SAS (serial attachment SCSI), a HSIC (high speed interchip), a SCSI (small computer system interface), a PCI (peripheral component interconnection), a PCIe (PCI express), a NVMe (nonvolatile memory express), a UFS (universal flash storage), a SD (secure digital), a MMC (multimedia card), an eMMC (embedded MMC), a DIMM (dual in-line memory module), a RDIMM (registered DIMM), a LRDIMM (load reduced DIMM), etc.

The buffer control circuit 126 is configured to control the RAM 123 under the control of the processor 122.

The memory interface 127 is configured to communicate with the nonvolatile memory device 110 under the control of the processor 122. As described with reference to FIG. 1, the memory interface 127 can exchange a command and data with the nonvolatile memory device 110 through an input/output channel. The memory interface 127 can exchange a control signal with the nonvolatile memory device 110 through a control channel.

In the case that the RAM 130 is not provided to the storage device 100, the buffer control circuit 126 may not be provided to the controller 120.

The processor 122 can control the controller 120 using codes. The processor 122 can load codes from a nonvolatile memory device (e.g., read only memory) being provided inside the controller 120. As another example, the processor 122 can load codes from the nonvolatile memory device 110 through the memory interface 127.

The bus 121 of the controller 120 may be divided into a control bus and a data bus. The data bus may be configured to transmit data inside the controller 120 and the control bus may be configured to transmit control information such as a command, an address, etc. inside the controller 120. The data bus and the control bus may be separated from each other and may not interfere with or affect each other. The data bus may be connected to the host interface 125, the buffer control circuit 126, the error correction block 124 and the memory interface 127. The control bus may be connected to the host interface 125, the processor 122, the buffer control circuit 126 and the memory interface 127.

Figure 12:
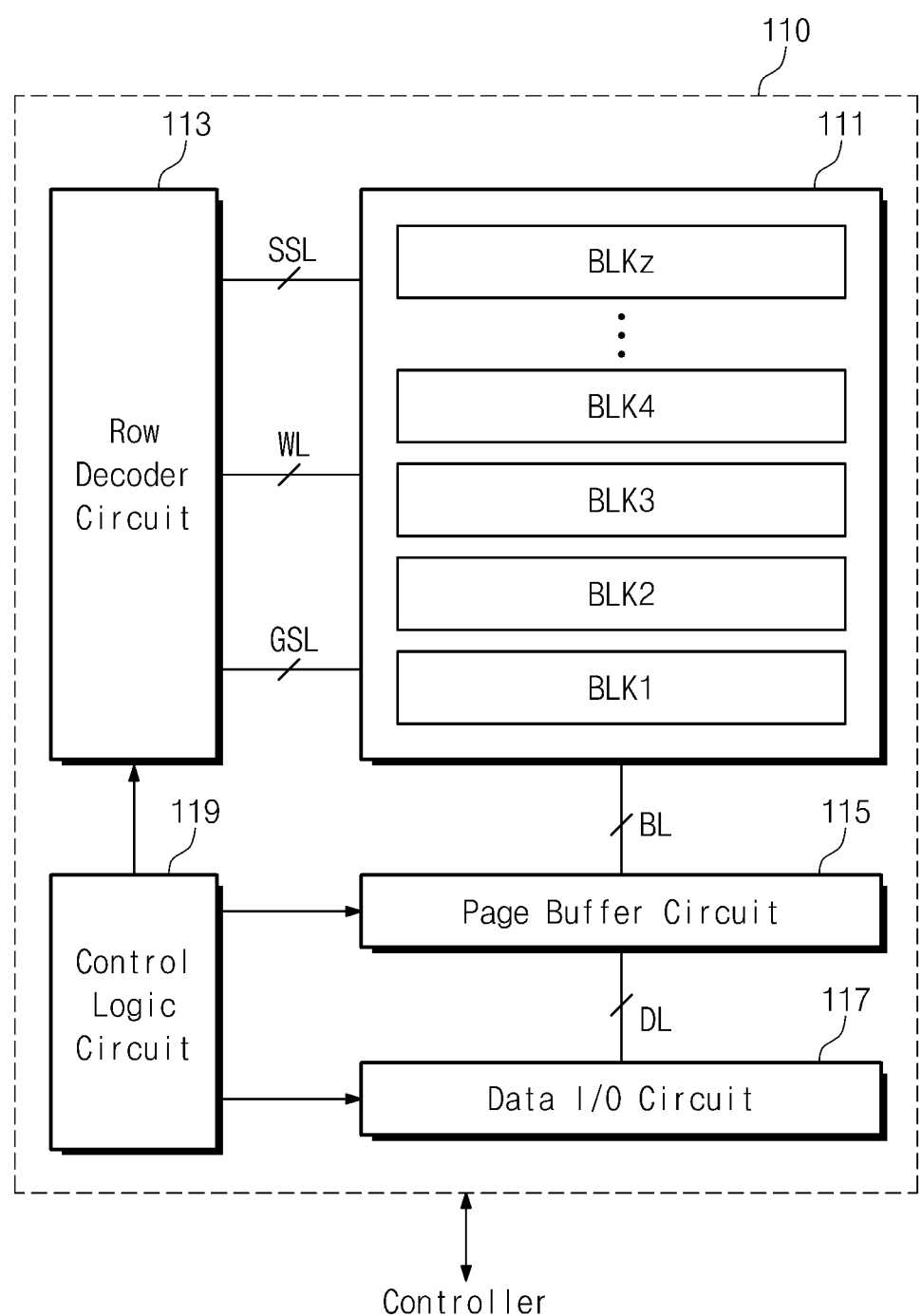
FIG. 12 is a block diagram illustrating a nonvolatile memory device according to an exemplary embodiment.

FIG. 12 is a block diagram illustrating a nonvolatile memory device in accordance with an exemplary embodiment. Referring to FIGS. 1 and 12, the nonvolatile memory device 110 includes a memory cell array 111, a row decoder circuit 113, a page buffer circuit 115, a data input/output circuit 117 and a control logic circuit 119.

The memory cell array 111 includes a plurality of memory blocks BLK1~BLKz. Each memory block includes a plurality of memory cells. Each memory block may be connected to the row decoder circuit 113 through at least one ground select line GSL, a plurality of word lines WL, and at least one string select line SSL. Each memory block may be connected to the page buffer circuit 115 through a plurality of bit lines BL. The memory blocks BLK1~BLKz may be connected to the bit lines BL in common. Memory cells of the memory blocks BLK1~BLKz may have the same structure.

Each of the memory blocks BLK1~BLKz may be a unit of an erase operation. Memory cells of the memory cell array 111 may be erased by a memory block unit. Memory cells that belong to one memory block may be erased at the same time. As another example, each memory block may be divided into a plurality of sub blocks. Each sub block may be a unit of an erase operation.

Each of the memory blocks BLK1~BLKz may include a physical storage space distinguished by a block address. Each of the word lines WL may correspond to the physical storage space distinguished by a row address. Each of the bit lines BL may correspond to the physical storage space distinguished by a column address.

The row decoder circuit 113 is connected to the memory cell array 111 through a plurality of ground select lines GSL, a plurality of word lines WL, and a plurality of string select lines SSL. The row decoder circuit 113 operates under the control of the control logic circuit 119. The row decoder circuit 113 can decode an address being received from the controller 120 through an input/output channel to control the string select lines SSL, the word lines WL and the ground select lines GSL according to the decoded address.

For example, in a program operation, the row decoder circuit 113 can apply a program voltage VPGM to a selected word line of a memory block selected by an address and can apply a pass voltage VPASS to unselected word lines of the selected memory block. In a read operation, the row decoder circuit 113 can apply a select read voltage VRD to a selected word line selected by an address and can apply an unselect read voltage VREAD to unselected word lines of a selected memory block. In an erase operation, the row decoder circuit 113 can apply erase voltages (e.g., a ground voltage or low voltages having levels similar to the ground voltage) to word lines of a memory block selected by an address.

The page buffer circuit 115 is connected to the memory cell array 111 through a plurality of bit lines BL. The page buffer circuit 115 is connected to the data input/output circuit 117 through a plurality of data lines DL. The page buffer circuit 115 operates under the control of the control logic circuit 119.

In a program operation, the page buffer circuit 115 can store data to be programmed in memory cells. On the basis of stored data, the page buffer circuit 115 can apply voltages to the bit lines BL. For example, the page buffer circuit 115 can function as a write driver. In a read operation, the page buffer circuit 115 can sense voltages of the bit lines BL and store a sensing result. For example, the page buffer circuit 115 can function as a sense amplifier.

The data input/output circuit 117 is connected to the page buffer circuit 115 through the data lines DL. The data input/output circuit 117 can output data read by the page buffer circuit 115 to the controller 120 through an input/output channel and transmit data being received from the controller 120 through the input/output channel to the page buffer circuit 115.

The control logic circuit 119 can receive a command from the controller 120 through the input/output channel and can receive a control signal from the controller 120 through a control channel. In response to the control signal, the control logic circuit 119 can receive a command being received through the input/output channel, can route an address being received through the input/output channel to the row decoder circuit 113 and can route data being received through the input/output channel to the data input/output circuit 117. The control logic circuit 119 can decode the received command and control the nonvolatile memory device 110 according to the decoded command.

In a read operation, the control logic circuit 119 can generate a data strobe signal DQS from a read enable signal /RE being received from the controller 120 through the control channel. The generated data strobe signal DQS can be output to the controller 120 through the control channel. In write operation, the control logic circuit 119 can receive the data strobe signal DQS from the controller 120 through the control channel.

Figure 13:
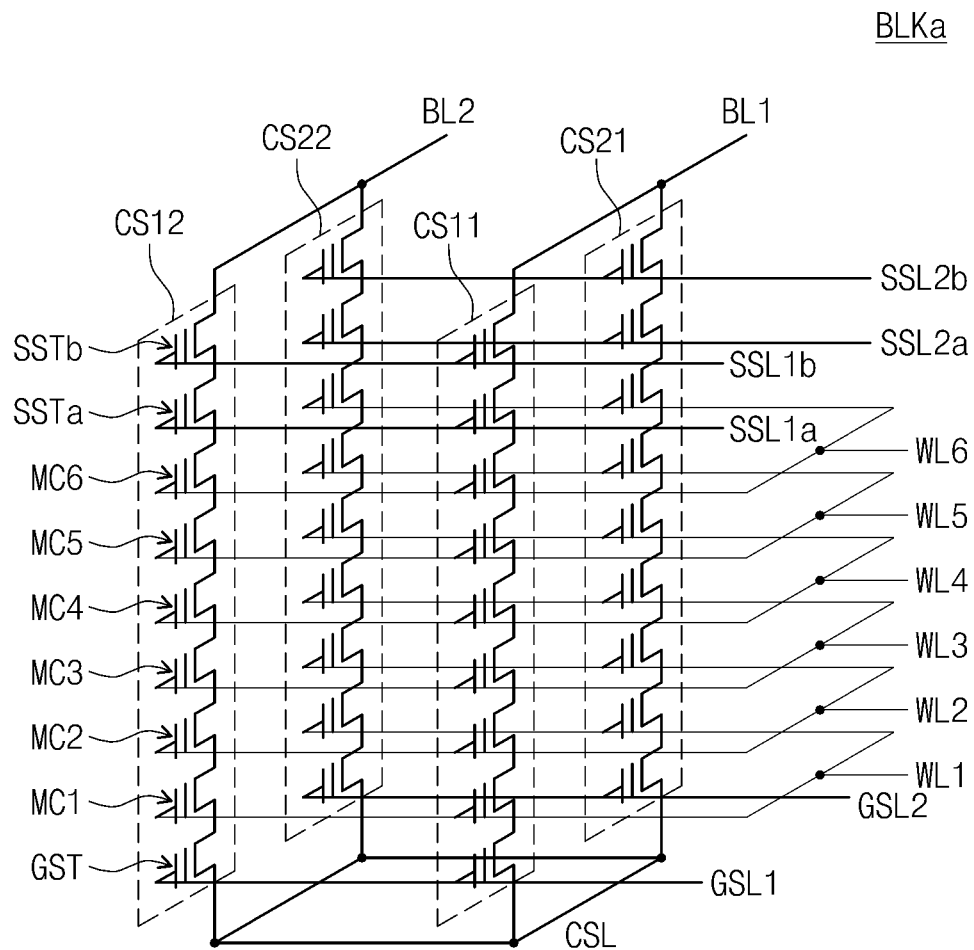
FIG. 13 is a block diagram illustrating a memory block according to an exemplary embodiment.
Figure 13:
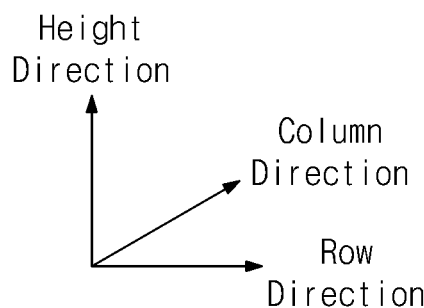

FIG. 13 is a block diagram illustrating a memory block in accordance with exemplary embodiments of the inventive concept. Referring to FIG. 13, the memory block BLKa includes a plurality of cell strings (CS11~CS21, CS12~CS22). The cell strings (CS11~CS21, CS12~CS22) may be arranged along a row direction and a column direction to form rows and columns.

For example, the cell strings CS11 and CS12 arranged along the row direction may form a first row and the cell strings CS21 and CS22 arranged along the row direction may form a second row. The cell strings CS11 and CS21 arranged along the column direction may form a first column and the cell strings CS12 and CS22 arranged along the column direction may form a second column.

Each cell string may include a plurality of transistors. The cell transistors include ground select transistors GST, memory cells MC1~MC6, and string select transistors SSTa and SSTb. The ground select transistor GST, the memory cells MC1~MC6 and string select transistors SSTa and SSTb of each cell string may be laminated in a height direction perpendicular to a plane (e.g., a plane on a substrate of the memory block BLKa) on which the cell strings (CS11~CS21, CS12~CS22) are arranged along rows and columns.

The cell transistors may be charge trap type transistors having threshold voltages that vary depending on the amounts of charges trapped in an insulating layer.

Sources of the lowermost ground select transistors GST may be connected to a common source line CSL in common.

Control gates of the ground select transistors GST of the cell strings (CS11~CS21, CS12~CS22) may be connected to ground select lines GSL1 and GSL2 respectively. Ground select transistors of the same row may be connected to the same ground select line and ground select transistors of different rows may be connected to different ground select lines. For example, ground select transistors GST of the cell strings CS11 and CS12 of the first row may be connected to the first ground select line GSL1 and ground select transistors GST of the cell strings CS21 and CS22 of the second row may be connected to the second ground select line GSL2.

Control gates of memory cells located at the same height (or order) from a substrate (or ground select transistors GST) may be connected to one word line in common, and control gates of memory cells located at different heights (or orders) from the substrate (or ground select transistors GST) may be connected to different word lines WL1~WL6 respectively. For example, the memory cells MC1 are connected to the word line WL1 in common. The memory cells MC2 are connected to the word line WL2 in common. The memory cells MC3 are connected to the word line WL3 in common. The memory cells MC4 are connected to the word line WL4 in common. The memory cells MC5 are connected to the word line WL5 in common. The memory cells MC6 are connected to the word line WL6 in common.

At first string select transistors SSTa of the same height (or order) of the cell strings (CS11~CS21, CS12~CS22), control gates of the first string select transistors SSTa of different rows are connected to different string select lines SSL1a~SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At second string select transistors SSTb of the same height (or order) of the cell strings (CS11~CS21, CS12~CS22), control gates of the second string select transistors SSTb of different rows are connected to different string select lines SSL1b~SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

That is, cell strings of different rows are connected to different string select lines. String select transistors of the same height (or order) of cell strings of the same row are connected to the same string select line. String select transistors of different heights (or orders) of cell strings of the same row are connected to different string select lines.

String select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings (CS11~CS21, CS12~CS22) are connected to different bit lines BL1 and BL2 respectively. For example, the string select transistors SSTb of the cell strings CS11~CS21 of the first column are connected to the bit line BL1 in common. The string select transistors SSTb of the cell strings CS12~CS22 of the second column are connected to the bit line BL2 in common.

The cell strings CS11 and CS12 may form a first plane. The cell strings CS21 and CS22 may form a second plane.

In a memory block BLKa, memory cells of each height of each plane may form a physical page. The physical page may be a write unit and a read unit. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected. In the selected plane, one row of the memory cells MC may be selected by the word lines WL1~WL6. In the selected row, a select voltage may be applied to the second word line WL2 and an unselect voltage may be applied to the remaining word lines WL1 and WL3~WL6. That is, a physical page corresponding to the second word line WL2 of the second plane may be selected by controlling voltages of the string select lines SSL1a, SSL1b, SSL2a and SSL2b and the word lines WL1~WL6. In the memory cells MC2 of the selected physical page, a write or read operation may be performed.

In the memory block BLKa, an erase of the memory cells MC1~MC6 may be performed by a memory block unit or a sub block unit. When an erase operation is performed by a memory block unit, all the memory cells MC of the memory block BLKa may be erased at the same time according to an erase request (e.g., an erase request from an external memory controller). When an erase operation is performed by a sub block unit, a part of the memory cells MC1~MC6 of the memory block BLKa may be erased at the same time according to an erase request and the remaining memory cells may be erase-prohibited. A low voltage (for example, a ground voltage or a voltage having a level similar to the ground voltage) may be supplied to a word line connected to memory cells MC being erased and a word line connected to erase-prohibited memory cells MC may be floated.

The memory block BLKa may include a physical storage space distinguished by a block address. Each of the word lines WL1~WL6 may correspond to a physical storage space distinguished by a row address. Each of the bit lines BL1 and BL2 may correspond to a physical storage space distinguished by a column address. Each of the string select lines SSL1a and SSL2a, or SSL1b and SSL2b of different rows or the ground select lines GSL1 and GSL2 of different rows may correspond to a physical storage space distinguished by a plane address.

The memory block BLKa illustrated in FIG. 2 is illustrative. A technical spirit of the inventive concept is not limited to the memory block BLKa illustrated in FIG. 2. For example, the number of rows of cell strings may increase or decrease. As the number of rows of cell strings changes, the number of string select lines or ground select lines connected to rows of the cell strings, and the number of cell strings connected to one bit line may also be changed.

The number of columns of cell strings may increase or decrease. As the number of columns of cell strings changes, the number of bit lines connected to columns of the cell strings, and the number of cell strings connected to one string select line may also be changed.

A height of the cell strings may increase or decrease. For example, the number of ground select transistors, memory cells or string select transistors that are laminated on each cell string may increase or decrease.

Memory cells MC that belong to one physical page may correspond to at least three logical pages. For example, k (k is a positive integer greater than 2) number of bits may be programmed in one memory cell MC. In the memory cells MC that belong to one physical page, k number of bits being programmed in each memory cell MC may form k number of logical pages respectively.

For example, one physical page includes a physical storage space distinguished by a block address, a row address, a column address and a plane address. One physical page may include two or more logical pages. Each of the logical pages may include a logical storage space distinguished by an additional address (or offset) distinguishing logical pages together with an address of the physical page.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

Figure 14:
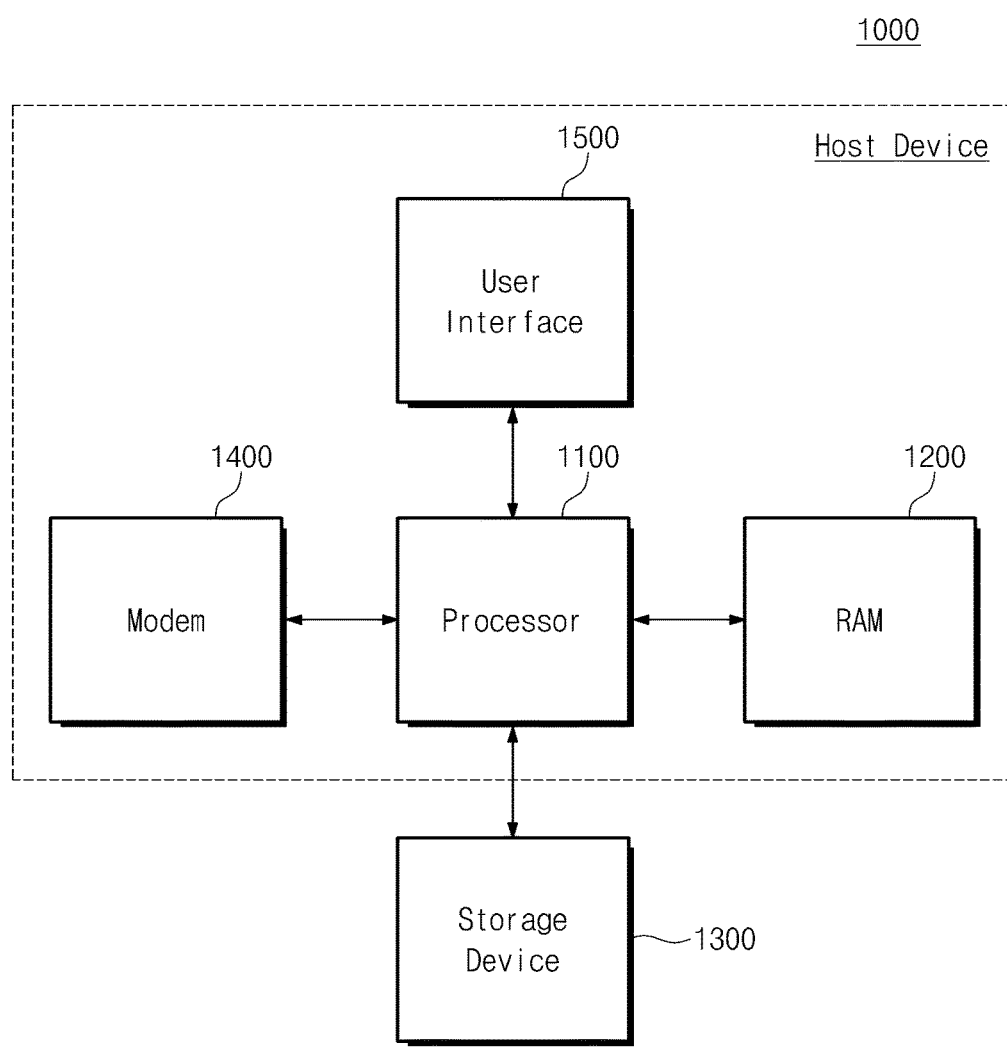
FIG. 14 is a block diagram illustrating a computing device according to an exemplary embodiment.

FIG. 14 is a block diagram illustrating a computing device in accordance with exemplary embodiments of the inventive concept. Referring to FIG. 14, the computing device 1000 includes a processor 1100, a memory 1200, a storage device 1300, a modem 1400 and a user interface 1500.

The processor 1100 can control an overall operation of the computing device 1000 and perform a logical operation. The processor 1100 may be a hardware-based data processing device including a circuit physically constituted to perform operations being expressed by a command included in a code or a program. For example, the processor 1100 can be constituted by a system-on-chip SoC. The processor 1100 may be a general purpose processor, a special purpose processor, or an application processor.

The RAM 1200 can communicate with the processor 1100. The RAM 1200 may be a main memory of the processor 1100 or the computing device 1000. The processor 1100 can temporarily store a code or data in the RAM 1200. The processor 1100 can execute a code and process data using the RAM 1200. The processor 1100 can execute various software such as an operating system, an application, etc., by using the RAM 1200. The processor 1100 can control an overall operation of the computing device 1000 using the RAM 1200. The RAM 1200 may include a volatile memory such as a SRAM, a DRAM, a SDRAM, etc. or a nonvolatile memory such as a PRAM, a MRAM, an RRAM, a FeRAM, etc.

The storage device 1300 can communicate with the processor 1100. The storage device 1300 can store data which has to be preserved for a long time. That is, the processor 1100 can store data which has to be preserved for a long time in the storage device 1300. The storage device 1300 can store a boot image to drive the computing device 1000. The storage device 1300 can store source codes of various software such as an operating system, an application, etc. The storage device 1300 can store data processed by various software such as an operating system, an application, etc.

The processor 1100 can drive various software such as an operating system, an application, etc. by loading source codes stored in the storage device 1300 in the RAM 1200 and executing the codes loaded in the RAM 1200. The processor 1100 can load data stored in the storage device 1300 in the RAM 1200 and process data loaded in the RAM 1200. The processor 1100 can store data desired to be preserved for a long time among data stored in the RAM 1200 in the storage device 1300.

The data storage device 1300 may include a nonvolatile memory such as a flash memory, a PRAM, a MRAM an RRAM, a FRAM, etc.

The modem 1400 can perform a communication with an external device according to a control of the processor 1100. For example, the modem 1400 can perform a wired or wireless communication with an external device. The modem 140 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), a PCI express (PCIe), a nonvolatile memory express (NVMe), a universal flash storage (UFS), a secure digital (SD), a SDIO, a universal asynchronous receiver transmitter (UART), a SPI (serial peripheral interface), a high speed SPI (HS-SPI), a RS232, an inter-integrated circuit (I2C), a HS-I2C, an integrated-interchip sound (I2S), a sony/philips digital interface (S/PDIF), a multimedia card (MMC), an embedded MMC (eMMC), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, a piezoelectric element, etc. The user interface 1500 may include user output interfaces such as a liquid crystal display (LCD), an organic light emitting diode (OLED) display, an active matrix OLED (AMOLED) display, a LED, a speaker, a motor, etc.

The storage device 1300 may be embodied by the storage device 100 in accordance with some exemplary embodiments of the inventive concept. The processor 1100, the RAM 1200, the modem 1400 and the user interface 1500 may form a host device communicating with the storage device 1300.

According to exemplary embodiments of the inventive concept, an amount of data to be migrated in one migration operation is dynamically adjusted according to reliability of a nonvolatile memory device and an amount of valid data which is a target of a read reclaim. Thus, latency that occurs by a read reclaim is reduced while maintaining reliability of data which is a target of a read reclaim. That is, a storage device having an improved operation speed is provided.

Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications and equivalents are intended to be included within the scope of the inventive concept as defined in the claims.

What is claimed is:

1. A storage device comprising:
   a nonvolatile memory device including memory blocks; and
   a controller configured to perform write, read and erase operations with respect to a selected memory block from among the memory blocks,
   wherein the controller is configured to, based on a number of error bits being greater than a critical value in a read operation with respect to the selected memory block, perform a first read reclaim of migrating valid data stored in the selected memory block to another memory block through at least two migration operations,
   wherein, in response to the valid data being migrated to the another memory block, the valid data does not exist in the selected memory block, and
   wherein in the first read reclaim, the controller is configured to adjust an amount of data to be migrated in one migration operation, among the at least two migration operations, based on reliability of the selected memory block, the reliability indicating a number of times of read operations that can be performed in the selected memory block without losing data of the selected memory block.

2. The storage device of claim 1, wherein the controller is configured to, based on a second read reclaim that is already being performed when the first read reclaim is to begin, increase the amount of data to be migrated in the one migration operation in the second read reclaim.

3. The storage device of claim 2, wherein the controller is configured to, based on the second read reclaim being completed, reduce the amount of data to be migrated in the one migration operation in the first read reclaim.

4. The storage device of claim 1, wherein the controller is configured to, based on increased reliability of the selected memory block, reduce the amount of data to be migrated in the one migration operation in the first read reclaim.

5. The storage device of claim 1, wherein the controller is configured to, based on decreased reliability of the selected memory block, increase the amount of data to be migrated in the one migration operation in the first read reclaim.

6. The storage device of claim 1, wherein the controller is configured to, based on the read operation being performed in a target memory block among target memory blocks which are targets of a third read reclaim, perform the one migration operation with respect to the target memory blocks.

7. The storage device of claim 1, wherein the controller is configured to, based on a read request being received from an external host, perform the one migration operation with respect to target memory blocks which are targets of a third read reclaim.

8. The storage device of claim 1, wherein the controller is configured to, based on a third read reclaim that is already being performed when the first read reclaim is to begin, perform the first read reclaim in response to completion of the third read reclaim.

9. The storage device of claim 1, wherein a memory block among the memory blocks comprises cell strings disposed on a substrate, and
wherein the cell strings respectively comprise at least one select transistor and memory cells, the at least one select transistor and the memory cells being laminated in a direction perpendicular to the substrate.

10. The storage device of claim 9, wherein the at least one select transistor and the memory cells comprise a charge trap layer.

11. A storage device comprising:
a random access memory;
a nonvolatile memory device including memory blocks; and
a controller configured to perform write, read and erase operations with respect to a selected memory block from among the memory blocks,
wherein the controller is configured to, based on a number of error bits being greater than a critical value in a read operation with respect to the selected memory block, perform a first read reclaim through at least two migration operations each including reading valid data stored in the selected memory block, storing the valid data in the random access memory, and writing the valid data stored in the random access memory in another memory block of the nonvolatile memory device,
wherein, in response to the valid data being written to the another memory block, the valid data does not exist in the selected memory block, and
wherein in the first read reclaim, the controller is configured to adjust an amount of data to be migrated from the selected memory block to the another memory block in one migration operation, among the at least two migration operations, based on reliability of the selected memory block, the reliability indicating a number of times of read operations that can be performed in the selected memory block without losing data of the selected memory block.

12. The storage device of claim 11, wherein the random access memory, the nonvolatile memory device and the controller form a SSD (solid state drive).

13. The storage device of claim 11, wherein the controller is configured to reduce the amount of data to be migrated based on an increase of the reliability of the selected memory block.

14. The storage device of claim 11, wherein the controller is configured to adjust the amount of data to be migrated based on at least one of a number of erases of the selected memory block, elapsed time from when the valid data is written in the selected memory block or a difference between a temperature when the valid data is written in the selected memory block and a temperature when the first read reclaim is performed.

15. The storage device of claim 11, wherein the controller is configured to adjust the amount of data to be migrated based on an amount of all valid data of all memory blocks on which a second read reclaim, including the first read reclaim, is to be performed from among the memory blocks.

16. A storage device comprising:
a nonvolatile memory device including memory blocks; and
a controller configured to, based on a number of error bits being greater than a critical value in a read operation with respect to a selected memory block from among the memory blocks, perform a first read reclaim of migrating valid data stored in the selected memory block to another memory block through at least two migration operations,
wherein, in response to the valid data being migrated to the another memory block, the valid data does not exist in the selected memory block, and
wherein the controller is configured to adjust an amount of data to be migrated in one migration operation, among the at least two migration operations in the first read reclaim, based on reliability of the selected memory block, the reliability indicating a number of times of read operations that can be performed in the selected memory block without losing data of the selected memory block.

17. The storage device of claim 16, wherein the controller is further configured to, based on a second read reclaim that is already being performed when the first read reclaim begins, increase the amount of data to be migrated in the one migration operation in the second read reclaim.

18. The storage device of claim 17, wherein the controller is configured to reduce the amount of data to be migrated in the one migration operation in the first read reclaim based on the second read reclaim being completed.

19. The storage device of claim 16, wherein the controller is configured to reduce the amount of data to be migrated as the reliability of the selected memory block increases.

20. The storage device of claim 16, wherein the controller is configured to increase the amount of data to be migrated as the reliability of the selected memory block decreases.

* * * * *